United States Patent
Khlat et al.

(10) Patent No.: US 9,935,662 B2
(45) Date of Patent: Apr. 3, 2018

(54) TRANSMIT SPECTRAL REGROWTH CANCELLATION AT RECEIVER PORT

(71) Applicant: RF Micro Devices, Inc., Greensboro, NC (US)

(72) Inventors: Nadim Khlat, Cugnaux (FR); Andrew F. Folkmann, Cedar Rapids, IA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/131,417

(22) Filed: Apr. 18, 2016

(65) Prior Publication Data

US 2017/0026064 A1  Jan. 26, 2017

Related U.S. Application Data (60) Provisional application No. 62/196,364, filed on Jul. 24, 2015.

(51) Int. Cl.
| | |
|---|---|
| *H04B 1/00* | (2006.01) |
| *H04B 1/04* | (2006.01) |
| *H04L 5/14* | (2006.01) |

(52) U.S. Cl.
CPC ........... *H04B 1/006* (2013.01); *H04B 1/0458* (2013.01); *H04B 1/0475* (2013.01); *H04B 2001/0408* (2013.01); *H04L 5/14* (2013.01)

(58) Field of Classification Search
CPC ...... H04B 1/04; H04B 1/0458; H04B 1/0475; H04B 1/0483; H04B 2001/0408; H04L 5/0001; H04L 5/14; H04L 5/16
USPC ......................... 375/295–297, 299, 300, 308; 455/101–103, 108, 112, 113, 114.2, 455/114.3, 129
See application file for complete search history.

(56) References Cited

U.S. PATENT DOCUMENTS

| | | | | |
|---|---|---|---|---|
| 2002/0090974 A1* | 7/2002 | Hagn | ..................... | H04B 1/005 455/552.1 |
| 2005/0255810 A1* | 11/2005 | Monroe | ................... | H04B 1/48 455/78 |
| 2008/0274709 A1* | 11/2008 | Goto | .................... | H04B 5/0062 455/205 |
| 2010/0277289 A1* | 11/2010 | Brauner | ............ | G06K 7/10336 340/10.51 |
| 2011/0300914 A1* | 12/2011 | Gudem | ................ | H04B 1/1027 455/574 |

(Continued)

*Primary Examiner* — Young T Tse
(74) *Attorney, Agent, or Firm* — Withrow & Terranova, P.L.L.C.

(57) ABSTRACT

A front-end module configured to cancel unwanted transmit spectrum at one or more receivers comprises at least one transmitter having a power amplifier and configured to transmit signals to an antenna. The front-end module also comprises at least one receiver to receive the transmit signals, wherein the at least one receiver receives at least a portion of unwanted transmit spectrum. A directional coupler couples at least a portion of a transmit output signal from the power amplifier to provide a coupled transmit output signal to signal conditioning circuitry associated with the at least one receiver and configured to condition the coupled transmit output signal to generate a conditioned transmit signal to provide to the at least one receiver, wherein the conditioned transmit signal at least partially cancels the unwanted transmit spectrum. The signal conditioning circuitry may adjust the amplitude and phase of the coupled transmit output signal.

20 Claims, 4 Drawing Sheets

(56) References Cited

U.S. PATENT DOCUMENTS

2013/0217343 A1\* 8/2013 Tenbroek .............. H04W 24/00
   455/77
2014/0269858 A1\* 9/2014 Lukashevich .......... H04L 25/08
   375/219
2017/0026104 A1\* 1/2017 Lange ...................... H04B 7/14

\* cited by examiner

TRANSMIT SPECTRAL REGROWTH CANCELLATION AT RECEIVER PORT

RELATED APPLICATIONS

This application claims the benefit of U.S. provisional patent application Ser. No. 62/196,364, filed Jul. 24, 2015, entitled "TRANSMIT SPECTRAL REGROWTH CANCELLATION AT RECEIVER PORT," the disclosure of which is hereby incorporated herein by reference in its entirety.

FIELD OF THE DISCLOSURE

The present disclosure relates to transmit and receive modules, and specifically to cancellation of unwanted transmit spectrum regrowth in the receive band of receive modules for use in a mobile device, particularly in full duplex systems.

BACKGROUND

In order to exploit the available frequency spectrum more efficiently, current wireless communication standards require a tight arrangement of communication channels in the frequency domain. As a result, transmit energy from a nearby transmitter (which may be referred to as a transmit blocker signal) can interfere with the receive signal due to the proximity of the transmit antenna to one or more receive antennas. Current digital signal processing techniques exist that enable receivers to filter out a desired signal from a relatively strong noise floor (i.e., a relatively low signal-to-noise (SNR) ratio). However, a so-called blocker signal, interferer signal, or interference signal that is at a nearby frequency and has a signal level comparable to or even higher than the desired signal, poses a challenge to most receiver structures. In particular, a receiver module needs to process the transmit blocker signal and the desired signal with relatively high fidelity, so that the transmit blocker signal may be separated from the desired signal.

Transmitter nonlinearity generates unwanted spectrum outside the main channel. Some of the unwanted spectrum falls in the receive band and causes receiver de-sense in full duplex systems. A filter in the transmit path is used to attenuate the unwanted spectrum to an acceptable level at the receive band frequencies, but the filter also has insertion loss in the transmit band. For a given filter technology there is an unavoidable trade-off between selectivity and insertion loss.

Accordingly, it would be desirable to reduce the selectivity required in the filter by partially cancelling the unwanted transmit spectrum without the costs and disadvantages of the filters.

SUMMARY

The present disclosure describes a system and method that partially cancels unwanted transmit spectrum received at a receiver or low noise amplifier (LNA) input in a full duplex system, such as a front-end module for use in a mobile device. In one embodiment, a front-end module configured to cancel unwanted transmit spectrum at one or more receivers in the front end module is provided. The front-end module comprises at least one transmitter, the at least one transmitter having a power amplifier and configured to transmit one or more transmit signals. The front-end module further comprises at least one receiver configured to receive one or more transmit signals from the at least one transmitter via an antenna, wherein the at least one receiver receives at least a portion of unwanted transmit spectrum in the received one or more transmit signals. A first directional coupler is configured to couple at least a portion of a transmit output signal from the power amplifier to provide a coupled transmit output signal to signal conditioning circuitry. The signal conditioning circuitry is associated with the at least one receiver and is configured to receive the coupled transmit output signal and condition the coupled transmit output signal to generate a conditioned transmit signal to provide to the at least one receiver. In one embodiment, the signal conditioning circuitry is further configured to adjust the amplitude and phase of the coupled transmit output signal in order to partially signals. In this manner, the conditioned transmit signal at least partially cancels the unwanted transmit spectrum in the received one or more transmit signals.

In another embodiment, a method for cancelling unwanted transmit spectrum at one or more receivers in a front end module is disclosed. The method comprises transmitting one or more transmit signals from at least one transmitter comprising a power amplifier to an antenna, wherein the antenna is configured to receive the one or more transmit signals from the at least one transmitter and transmit the one or more transmit signals to one or more receivers. The method also comprises receiving, at one or more receivers, one or more transmit signals from the at least one transmitter via the antenna, wherein the received one or more transmit signals comprise at least a portion of unwanted transmit spectrum. The method further comprises coupling at least a portion of a transmit output signal from the power amplifier to provide a coupled transmit output signal to signal conditioning circuitry. The method further comprises conditioning the coupled transmit output signal to generate a conditioned transmit signal, and providing the conditioned transmit signal to the one or more receivers. In one embodiment, the method includes adjusting the amplitude and phase of the coupled transmit output signal in order to partially cancel the unwanted transmit spectrum in the received one or more transmit signals. In this manner, the conditioned transmit signal at least partially cancels the unwanted transmit spectrum in the received one or more transmit signals.

Those skilled in the art will appreciate the scope of the present disclosure and realize additional aspects thereof after reading the following detailed description in association with the accompanying drawings.

BRIEF DESCRIPTION OF THE DRAWINGS

The accompanying drawing figures incorporated in and forming a part of this specification illustrate several aspects of the disclosure, and together with the description serve to explain the principles of the disclosure.

DETAILED DESCRIPTION

The present disclosure describes a system and method that partially cancels unwanted transmit spectrum received at a receiver or low noise amplifier (LNA) input in a full duplex system, such as a front-end module for use in a mobile device. In one embodiment, a front-end module configured to cancel unwanted transmit spectrum at one or more receivers in the front-end module is provided. The front-end module comprises at least one transmitter, the at least one transmitter having a power amplifier and configured to transmit one or more transmit signals. The front-end module also comprises an antenna configured to receive the one or more transmit signals from the at least one transmitter. The front-end module further comprises at least one receiver configured to receive one or more transmit signals from the at least one transmitter via the antenna, wherein the at least one receiver receives at least a portion of unwanted transmit spectrum in the received one or more transmit signals. A first directional coupler is configured to couple at least a portion of a transmit output signal from the power amplifier to provide a coupled transmit output signal to signal conditioning circuitry. The signal conditioning circuitry is associated with the at least one receiver and is configured to receive the coupled transmit output signal and condition the coupled transmit output signal to generate a conditioned transmit signal to provide to the at least one receiver. In one embodiment, the signal conditioning circuitry is further configured to adjust the amplitude and phase of the coupled transmit output signal in order to partially cancel the unwanted transmit spectrum in the received one or more transmit signals. In this manner, the conditioned transmit signal at least partially cancels the unwanted transmit spectrum in the received one or more transmit signals.

Figure 1:
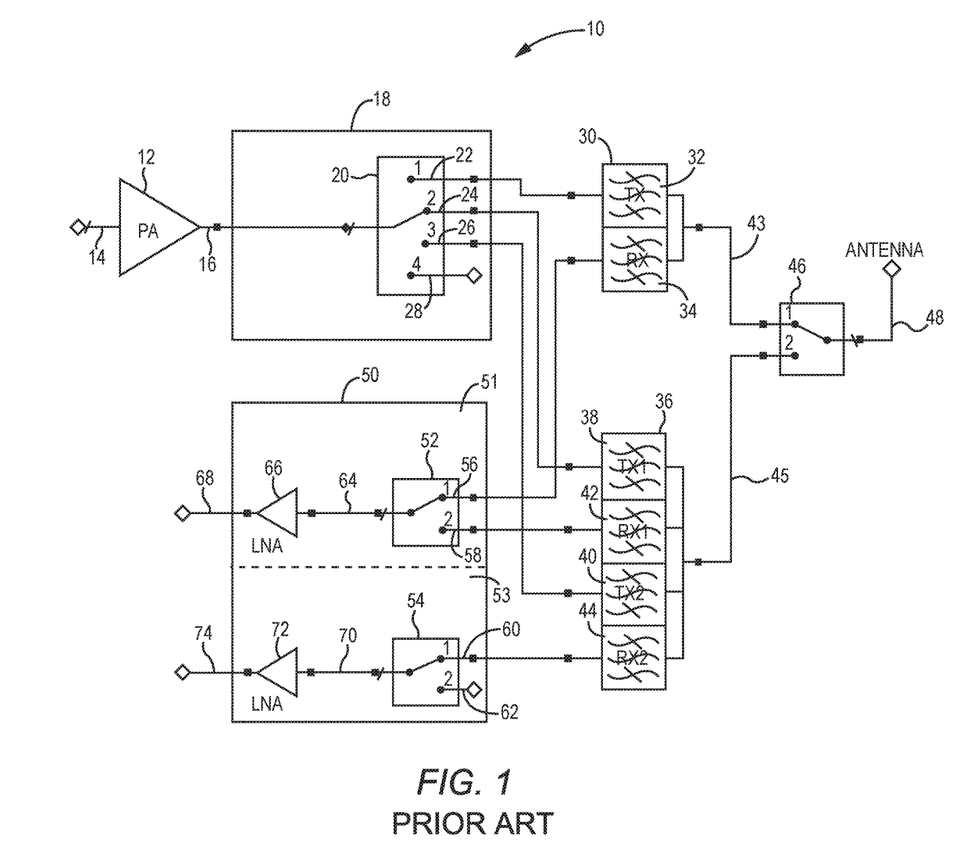
FIG. 1 illustrates an example of a typical handset front end with a multi-mode, multi-band power amplifier for transmitting signals to an antenna, where the multi-mode, multi-band power amplifier is switched to one of several transmit filters that isolates the transmit and receive frequencies for one or more bands, and a plurality of receivers for receiving transmitted signals from the antenna.

FIG. 1 illustrates an example of a typical handset front-end with a multi-mode, multi-band power amplifier for transmitting signals to an antenna, where the multi-mode, multi-band power amplifier is switched to one of several transmit filters that isolates the transmit and receive frequencies for one or more bands, and a plurality of receivers for receiving transmitted signals from the antenna.

A typical handset front-end 10 is shown in FIG. 1. A multi-mode, multi-band power amplifier 12 may have an input 14 and an output 16. A transmitter 18 may include a switch 20 for switching the output 16 via lines 22, 24, 26, and 28. The output 16 may be switched via the switch 20 to one of several transmit filters. Each transmit filter is part of a duplexer or quadplexer that isolates the transmit and receive frequencies for one or more bands. For example, the output 16 may be switched via the switch 20 via lines 22, 24, and 26 to transmit filters 32, 38, and 40, respectively, where transmit filter 32 is in duplexer 30 and transmit filters 38 and 40 are in quadplexer 36. The duplexer 30 also may include a receive filter 34. The quadplexer 36 may also include receive filters 42 and 44. The purpose of the transmit filters 32, 38, and 40 is to attenuate unwanted transmit spectrum that falls outside the transmit band of the transmitter 18. The transmitted signal is output from the duplexer 30 or quadplexer 36 via lines 43 and 45, respectively, to switch 46 to antenna 48. The switch 46 controls whether the signal transmitted to the antenna 48 is from duplexer 30 or quadplexer 36.

Still referring to FIG. 1, a receiver block 50 may have a plurality of receive paths for receiving transmitted signals, represented by a first receiver 51 and a second receiver 53. A signal is passed through one of the receive filters 34, 42, or 44 to the receiver block 50 via switches 52 or 54. For example, a receive signal may be filtered to the first receiver 51 through receive filter 34 via receiver input 56, or a signal may be filtered through receive filter 42 via receiver input 58 as controlled by switch 52. Or a receive signal may be filtered to the second receiver 53 through receive filter 44 through one or more receiver inputs 60 or 62 as controlled by switch 54. The receive filters 34, 42, and 44 are configured to eliminate large transmit signals outside the transmit band from hitting the receiver at the LNAs. In a first receiver 51, a filtered receive signal 64 is received at an input of LNA 66 and output as output signal 68. In a second receiver 53, a filtered receive signal 70 is received at an input of LNA 72 and output as output signal 74. A significant portion of the residual unwanted transmit spectrum that reaches the antenna 48 will be reflected and appear at the receiver input (input of LNA 66 or input of LNA 72), along with the desired received signal. The unwanted transmit spectrum reduces the signal-to-noise ratio at the input of the receiver, which degrades receive sensitivity. Receiver de-sense is reduced to acceptable levels in existing designs by placing high selectivity requirements on the transmit filter. Filter selectivity comes at a cost, however, in terms of complexity and insertion loss.

Figure 2:
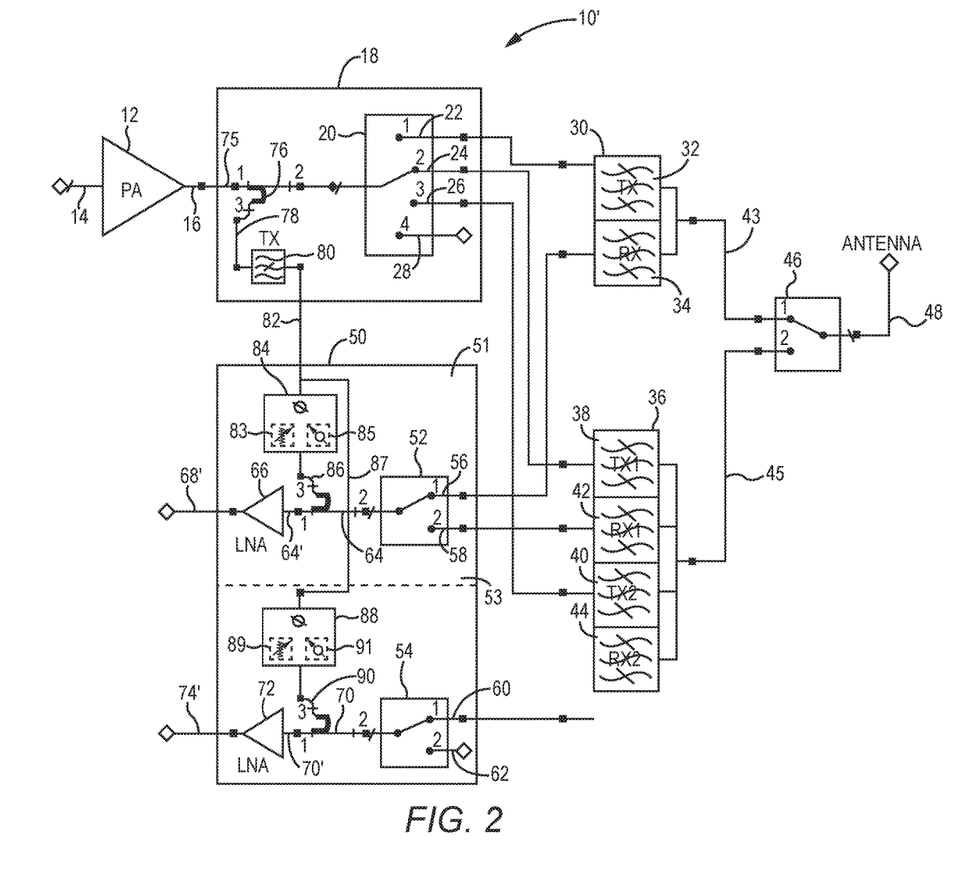
FIG. 2 illustrates the handset front end of FIG. 1, with additional circuitry and/or structure added to cancel unwanted transmit spectrum at the receiver or LNA input, according to an exemplary embodiment.

The primary benefit of the present disclosure is a reduction in the transmit filter selectivity required by providing partial cancellation of the unwanted transmit spectrum at the receiver or low-noise amplifier (LNA) input. This can be achieved by the architecture shown in FIG. 2. FIG. 2 illustrates the handset front-end of FIG. 1, with additional circuitry and/or structure added to cancel unwanted transmit spectrum at the receiver or LNA input.

A small portion of the power amplifier output signal 75 is coupled using a directional coupler 76 or other coupling mechanism, and passed as coupled transmit output signal 78 to a low power band reject filter 80. In one embodiment, only one thousandth of the power amplifier output signal 75 is coupled to the low power band reject filter 80. In one embodiment, a resistance divider or a capacitance divider may be used as the coupling mechanism to couple a small portion of the power amplifier output signal 75. A low power band reject filter 80 attenuates the transmit band frequencies but passes the transmitter output spectrum falling outside the transmit band. As in the case of the system in FIG. 1, a bandpass filter tuned to the transmit band frequency range filters the output of the transmitter, but some of the unwanted transmit spectrum still reaches the antenna 48 and ultimately the input of the receivers 51, 53, or LNAs 66 and 72. In FIG. 2, however, the coupled transmit output signal 78 is coupled via line 82 to the input 64' of the LNA 66 (first receiver 51) through a signal conditioning block 84 and a second directional coupler 86. In one embodiment, the signal conditioning block 84 comprises signal conditioning circuitry configured to accomplish the signal conditioning for generating a conditioned transmit signal to provide to the at least one receiver, wherein the conditioned transmit signal at least partially cancels the unwanted transmit spectrum in the received one or more transmit signals. In one embodiment, the signal conditioning block 84 (circuitry) adjusts the amplitude and phase of the coupled transmit output signal 78 to cancel the transmit signal appearing at the LNA 66 or receiver input 64' from the antenna 48. In one embodiment, the signal conditioning block 84 (circuitry) may include an electronically variable attenuator 83 and/or a phase shifter 85. The signal conditioning block 84 may produce a signal of equal magnitude but opposite phase to the unwanted transmit spectrum signal.

Still referring to FIG. 2, the coupled transmit output signal 78 is also coupled via line 87 to the input 70' of the LNA 72 (second receiver 53) through a signal conditioning block 88 and a directional coupler 90. In one embodiment, the signal conditioning block 88 comprises signal conditioning circuitry configured to accomplish the signal conditioning for generating a conditioned transmit signal to provide to the at least one receiver, wherein the conditioned transmit signal at least partially cancels the unwanted transmit spectrum in the received one or more transmit signals. In one embodiment, the signal conditioning block 88 (circuitry) adjusts the amplitude and phase of the coupled transmit output signal 78 to cancel the transmit signal appearing at the LNA 72 or receiver input 70' from the antenna 48. In one embodiment, the signal conditioning block 88 (circuitry) may include an electronically variable attenuator 89 and/or a phase shifter 91. The signal conditioning block 88 may produce a signal of equal magnitude but opposite phase to the unwanted transmit spectrum signal.

In one embodiment, the electrical delay through the transmit couple path is approximately equal to the electrical delay through the leakage path. Equalizing the delay through the two paths allows more complete cancellation across a wider bandwidth than would be possible if the delay through the two paths were not equal.

In a full duplex system, the frequency of the transmit band and the frequency at the receiver are synchronized. For any given frequency, there is a specific offset frequency between the transmit and the receive bands. In one embodiment, this offset frequency can be used by the signal conditioning blocks 84, 88 to more effectively cancel the unwanted transmit spectrum regrowth at the receiver.

Another feature of the present disclosure is compatibility with multiple receivers that may be used for diversity or downlink carrier aggregation. In a carrier aggregation system, a second receiver may receive a second frequency not synchronized with the transmit frequency. FIG. 2 illustrates a front-end design with two receivers 51, 53 for two different receive bands. Only one sample of the coupled transmit output signal 78 is required. Independent signal conditioning blocks 84 and 88 in the first and second receivers 51, 53, respectively, at each LNA 66, 72 or receiver input 66', 70', adjust the amplitude and phase of the coupled transmit output signal 78 to cancel the leakage transmit signal appearing at the input of the respective LNA 66, 72 or receiver 51, 53. The receive frequency for the two receive paths may be either above or below the transmit frequency. In particular, in one embodiment, transmit spectrum regrowth may be cancelled at a secondary receive carrier where it is closest to and thus will experience the highest sensitivity degradation without the transmit spectrum cancellation method described herein.

The signal conditioning blocks 84 and 88 may use several strategies for adjusting the amplitude and phase of the coupled transmit signal path. One option is to adjust amplitude and phase for maximum cancellation at a specific receive frequency. Another approach is to adjust for best compromise cancellation across the entire receive band. A third option is to adjust amplitude and phase for maximum cancellation at the edge of the receive band closest to the transmit band. Since the unwanted transmit spectrum decreases in amplitude as the frequency spacing from main channel increases, this option provides for maximum cancellation at the edge of the receive band closest to the transmit band, as shown in FIG. 3.

Figure 3:
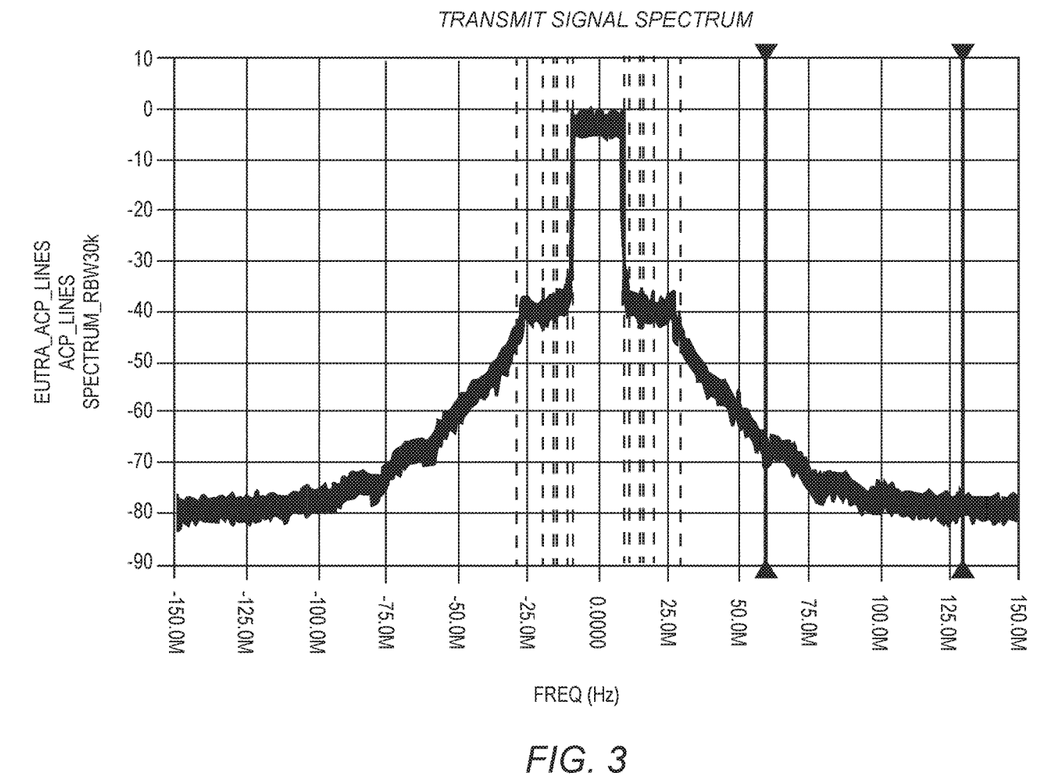
FIG. 3 is a graph that illustrates cancellation of unwanted transmit spectrum at an edge of a receive band closest to the transmit band when using the additional circuitry and/or structure added to cancel unwanted transmit spectrum at the receiver or LNA input illustrated in FIG. 2.

FIG. 3 is a graph that illustrates cancellation of unwanted transmit spectrum at an edge of a receive band closest to the transmit band when using the additional circuitry and/or structure added to cancel unwanted transmit spectrum at the receiver or LNA input illustrated in FIG. 2.

Duplexer isolation generally varies across the receive band and may have a null at the edge of the receive band closest to the transmit band. Consequently, transmit signal leakage may be maximum elsewhere in the receive band. The signal conditioning blocks 84 and 88 can adjust amplitude and phase for maximum cancellation at the receive frequency with maximum transmit signal leakage.

Figure 4:
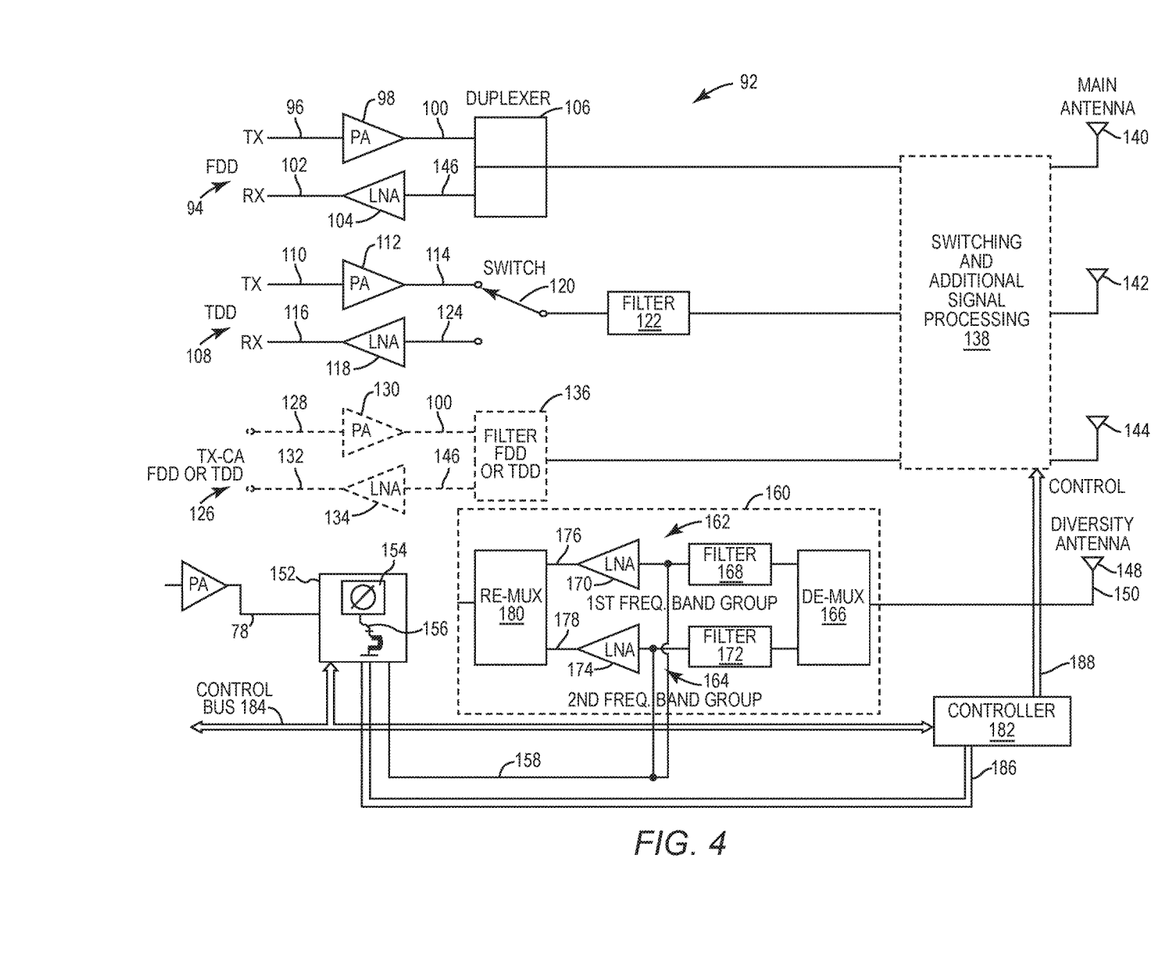
FIG. 4 shows an exemplary embodiment of a system in which transmit spectral regrowth cancellation circuitry can be used in a receive sub-module having at least two diversity receive paths.

FIG. 4 shows an exemplary system 92 in which transmit spectral regrowth cancellation circuitry can be used in a receive sub-module having at least two diversity receive paths. The exemplary system 92 may include a front-end module such as a Frequency Division Duplex (FDD) transmit/receive (TX/RX) module 94. The FDD TX/RX module 94 may have a transmit path where a FDD TX signal 96 is input into a power amplifier 98 and then the amplified FDD TX signal 100 is provided to a duplexer 106. The FDD TX/RX module 94 may also have a receive path 102 for receiving a signal. The receive path 102 may include a LNA 104. The duplexer 106 may forward the amplified FDD TX signal 100 to a main antenna 140 via switching and additional signal processing block 138. The duplexer 106 may also receive and forward a FDD RX signal 146 from the main antenna 140 via the switching and additional signal processing block 138 to the LNA 104.

Still referring to FIG. 4, the exemplary system 92 may include another front-end module such as a Time Division Duplex (TDD) transmit/receive (TX/RX) module 108. The TDD TX/RX module 108 may have a transmit path where a TDD TX signal 110 is input into a power amplifier 112 and then the amplified TDD TX signal 114 is provided to a switch 120 which selectively switches between the transmit path and a receive path 116. During transmission, the switch 120 is selectively connected to a filter 122, and the amplified TDD TX signal 114 is forwarded to an antenna 142 via the switching and additional signal processing block 138. The TDD TX/RX module 108 may also receive and forward a TDD RX signal 124 from the antenna 142 via the switching and additional signal processing block 138 and the filter 122, where the filter 122 is switched to the receive path 116. The TDD RX signal 124 may be passed through an LNA 118.

Still referring to FIG. 4, the exemplary system 92 may optionally include one or more additional front-end modules, such as in the case of carrier aggregation. Such a module may be referred to as a TX-CA module 126. The TX-CA module 126 may be either a FDD or a TDD module, and may include a transmit path 128 that includes a power amplifier 130 and a receive path 132 that includes an LNA 134. The TX-CA module 126 may also include a filter 136, and operates in a similar manner as the FDD TX/RX module 94 or the TDD TX/RX module 108 to provide a transmit signal to, and receive a receive signal from, an associated antenna 144 via the switching and additional signal processing block 138.

With continued reference to FIG. 4, one or more of the transmit signals transmitted to the antennas 140, 142, and/or 144 by the front-end modules 94, 108, and/or 126, may be received by diversity antenna 148 and forwarded to a receive module 160. The receive module 160 may include a portion that comprises at least two receive paths, a first receive path 162 and a second receive path 164. Though the embodiment in FIG. 4 shows two receive paths, more than two receive paths may be present, depending on the number of front-end modules and/or the number of carriers. In one embodiment, the first receive path 162 may receive and process a first set of signals, such as signals in a first frequency band group, while the second receive path 164 may receive and process a second set of signals, such as signals in a second frequency band group. For example, in one embodiment, the first receive path 162 may receive and process low-band frequency signals, while the second receive path 164 may receive and process mid-band and high-band frequency signals. The first set of signals received by the first receive path 162 includes at least one desired receive signal and at least some unwanted transmit spectrum from one or more of the transmit modules. The second set of signals received by the second receive path 164 includes at least one desired receive signal and at least some unwanted transmit spectrum from one or more of the transmit modules.

With continued reference to FIG. 4, the signals 150 received at the diversity antenna 148 are provided to a demultiplexer 166, which provides the received signal to one of the receive paths 162 or 164. The first receive path 162 includes a filter 168 and an LNA 170. The second receive path 164 includes a filter 172 and an LNA 174. A remultiplexer 180 then takes processed signals 176 and 178 from the first receive path 162 and the second receive path 164, respectively, and provides an output receive signal 181. In one embodiment, the demultiplexer 166 and/or the remultiplexer 180 may be replaced with switches.

In one embodiment, as seen in FIG. 4, transmit spectral regrowth cancellation circuitry 152 may be placed between the diversity antenna 148 and the two or more receive paths 162 and 164, and before LNAs 170 and 174 in the first and second receive paths 162 and 164. The transmit spectral regrowth cancellation circuitry 152 may comprise a signal conditioning block 154 and a directional coupler 156 similar to the signal conditioning blocks 84 and 88 and the directional couplers 86 and 90 in FIG. 2. The transmit spectral regrowth cancellation circuitry 152 receives a small portion of the power amplifier output signal as coupled transmit signal 78 from one or more of the power amplifiers 98, 112, or 130. The signal conditioning block 154 and a directional coupler 156 are configured to adjusts the amplitude and phase of the coupled signal 78 to cancel the transmit signal appearing at the input of LNA 170 or LNA 174 from the diversity antenna 148.

Referring again to FIG. 4, a controller 182 may be used to selectively control the signal processing block 154 directly or via a control bus 184 by control signal 186, especially if active cancellation of the unwanted transmit spectrum is desired. The controller 182 may also provide communication and control signals 188 to the switching and additional signal processing block 138.

Those skilled in the art will recognize improvements and modifications to the present disclosure. All such improvements and modifications are considered within the scope of the concepts disclosed herein.

What is claimed is:

1. A front-end module configured to cancel unwanted transmit spectrum at one or more receivers in the front-end module comprising:

at least one transmitter, the at least one transmitter configured to receive a transmit output signal from a power amplifier and configured to transmit one or more transmit signals;

at least one receiver configured to receive the one or more transmit signals from the at least one transmitter via an antenna, wherein the at least one receiver receives at least a portion of the unwanted transmit spectrum in the received one or more transmit signals;

a first directional coupler associated with the at least one transmitter and configured to couple at least a portion of the transmit output signal from the power amplifier to provide a coupled transmit output signal; and signal conditioning circuitry associated with the at least one receiver and configured to receive the coupled transmit output signal and condition the coupled transmit output signal to generate a conditioned transmit signal to provide to the at least one receiver, wherein the conditioned transmit signal at least partially cancels the unwanted transmit spectrum in the received one or more transmit signals.

2. The front-end module of claim 1, further comprising a low power band reject filter associated with the at least one transmitter between the first directional coupler and the signal conditioning circuitry, wherein the low power band reject filter is configured to attenuate one or more frequencies of a transmit band and to pass transmitter spectrum falling outside the transmit band.

3. The front-end module of claim 1, further comprising a second directional coupler associated with the at least one receiver between the signal conditioning circuitry and an input of the at least one receiver.

4. The front-end module of claim 1, wherein the signal conditioning circuitry is further configured to adjust an amplitude and a phase of the coupled transmit output signal in order to partially cancel the unwanted transmit spectrum in the received one or more transmit signals.

5. The front-end module of claim 4, wherein the signal conditioning circuitry is further configured to adjust the amplitude and the phase of the coupled transmit output signal to generate the conditioned transmit signal, wherein the conditioned transmit signal has equal magnitude and opposite phase as the coupled transmit output signal.

6. The front-end module of claim 4, wherein the signal conditioning circuitry is further configured to adjust the amplitude and the phase of the coupled transmit output signal to provide the conditioned transmit signal, wherein the conditioned transmit signal provides maximum cancellation of the unwanted transmit spectrum for a specific receive frequency.

7. The front-end module of claim 4, wherein the signal conditioning circuitry is further configured to adjust the amplitude and the phase of the coupled transmit output signal to generate the conditioned transmit signal, wherein the conditioned transmit signal provides a best compromise cancellation of the unwanted transmit spectrum across an entirety of a receive band of frequencies.

8. The front-end module of claim 4, wherein the signal conditioning circuitry is further configured to adjust the amplitude and the phase of the coupled transmit output signal to generate the conditioned transmit signal, wherein the conditioned transmit signal provides maximum cancellation at an edge of a receive band of frequencies that is closest to a band of frequencies for the one or more transmit signals.

9. The front-end module of claim 1, wherein the signal conditioning circuitry comprises an electronically variable attenuator and a phase shifter.

10. The front-end module of claim 1, wherein the at least one receiver comprises a low noise amplifier and the signal conditioning circuitry provides the conditioned transmit signal to an input of the low noise amplifier.

11. The front-end module of claim 1, wherein the at least one receiver comprises a plurality of receivers.

12. The front-end module of claim 11, wherein each of the plurality of receivers comprises:
a low noise amplifier; and
associated signal conditioning circuitry configured to receive the coupled transmit output signal from the first directional coupler and condition the coupled transmit output signal to generate a conditioned transmit signal, wherein the conditioned transmit signal generated by each of the associated signal conditioning circuitry is provided to an input of the respective low noise amplifier of a respective one of the plurality of receivers to at least partially cancel unwanted transmit spectrum in one or more transmit signals received by the respective one of the plurality of receivers.

13. The front-end module of claim 12, wherein the signal conditioning circuitry associated with a secondary receiver of the plurality of receivers is configured to provide the conditioned transmit signal to the secondary receiver to cancel unwanted transmit spectrum regrowth at a secondary receiver carrier where the unwanted transmit spectrum regrowth is close to the one or more transmit signals such that the unwanted transmit spectrum regrowth is separated by a gap less than a frequency duplex.

14. A method for cancelling unwanted transmit spectrum at one or more receivers in a front-end module comprising:
providing a transmit output signal from a power amplifier;
transmitting one or more transmit signals from at least one transmitter to an antenna, wherein the antenna is configured to receive the one or more transmit signals from the at least one transmitter and transmit the one or more transmit signals to the one or more receivers;
receiving, at the one or more receivers, the one or more transmit signals from the at least one transmitter via the antenna, wherein the received one or more transmit signals comprise at least a portion of the unwanted transmit spectrum;
coupling, from a directional coupler associated with the at least one transmitter, at least a portion of the transmit output signal from the power amplifier to provide a coupled transmit output signal to signal conditioning circuitry associated with the one or more receivers;
conditioning the coupled transmit output signal by the signal conditioning circuitry to generate a conditioned transmit signal; and
providing the conditioned transmit signal to the one or more receivers,
wherein the conditioned transmit signal at least partially cancels the unwanted transmit spectrum in the received one or more transmit signals.

15. The method of claim 14, wherein the conditioning of the coupled transmit output signal comprises adjusting an amplitude and a phase of the coupled transmit output signal in order to partially cancel the unwanted transmit spectrum in the received one or more transmit signals.

16. The method of claim 15, wherein the conditioning of the coupled transmit output signal comprises adjusting the amplitude and the phase of the coupled transmit output signal to generate the conditioned transmit signal, wherein the conditioned transmit signal has equal magnitude and opposite phase as the coupled transmit output signal.

17. The method of claim 15, wherein the conditioning of the coupled transmit output signal comprises adjusting the amplitude and the phase of the coupled transmit output signal to provide the conditioned transmit signal, wherein the conditioned transmit signal provides maximum cancellation of the unwanted transmit spectrum for a specific receive frequency.

18. The method of claim 15, wherein the conditioning of the coupled transmit output signal comprises adjusting the amplitude and the phase of the coupled transmit output signal to generate the conditioned transmit signal, wherein the conditioned transmit signal provides a best compromise cancellation of the unwanted transmit spectrum across an entirety of a receive band of frequencies.

19. The method of claim 15, wherein the conditioning of the coupled transmit output signal comprises adjusting the amplitude and the phase of the coupled transmit output signal to generate the conditioned transmit signal, wherein the conditioned transmit signal provides maximum cancellation at an edge of a receive band of frequencies that is closest to a band of frequencies for the one or more transmit signals.

20. The method of claim 14, wherein the one or more receivers comprise a plurality of receivers, and the method further comprises providing the conditioned transmit signal to each of the plurality of receivers, wherein the conditioned transmit signal provided to a secondary receiver cancels unwanted transmit spectrum regrowth at the secondary receiver, where the unwanted transmit spectrum regrowth is close to the one or more transmit signals such that the unwanted transmit spectrum regrowth is separated by a gap less than a frequency duplex.

* * * * *

UNITED STATES PATENT AND TRADEMARK OFFICE
CERTIFICATE OF CORRECTION

PATENT NO. : 9,935,662 B2
APPLICATION NO. : 15/131417
DATED : April 3, 2018
INVENTOR(S) : Nadim Khlat and Andrew F. Folkmann It is certified that error appears in the above-identified patent and that said Letters Patent is hereby corrected as shown below:

In the Specification

In Column 2, Line 16, between "in order to partially" and "signals", insert --cancel the unwanted transmit spectrum in the received one or more transmit--.

In Column 5, Line 59, between "it is closest to" and "and thus will", insert --the transmit signal, i.e., it is separated by a gap less than the frequency duplex--.

Signed and Sealed this
Fifteenth Day of May, 2018

Andrei Iancu
*Director of the United States Patent and Trademark Office*